United States Patent [19]

Nelson et al.

[11] Patent Number: 5,002,123

[45] Date of Patent: Mar. 26, 1991

[54] LOW PRESSURE HIGH HEAT TRANSFER FLUID HEAT EXCHANGER

[75] Inventors: Richard D. Nelson; Dennis J. Herrell, both of Austin, Tex.

[73] Assignee: Microelectronics And Computer Technology Corporation, Austin, Tex.

[21] Appl. No.: 511,163

[22] Filed: Apr. 19, 1990

Related U.S. Application Data

[62] Division of Ser. No. 341,006, Apr. 20, 1989, Pat. No. 4,953,634.

[51] Int. Cl.⁵ ............................................. F28F 13/08
[52] U.S. Cl. ................................... 165/147; 165/80.3; 165/185
[58] Field of Search ................... 165/185, 80.4, 146, 165/147, 80.3; 361/384, 385

[56] References Cited

U.S. PATENT DOCUMENTS

| | | | |
|---|---|---|---|
| 1,825,321 | 9/1931 | LaMont et al. | 165/147 |
| 2,246,329 | 6/1941 | Telkes | 165/147 |
| 2,613,065 | 10/1952 | Didier | 257/124 |
| 2,696,369 | 12/1954 | Morley et al. | 165/147 X |
| 2,934,322 | 4/1966 | Hazard | 165/147 |
| 3,451,388 | 6/1969 | Eck | 165/147 X |
| 3,817,321 | 6/1974 | von Cube et al. | 165/105 |
| 4,103,737 | 8/1978 | Perkins | 165/80 |
| 4,156,625 | 5/1979 | Wachendorfer, Sr. | 156/245 |
| 4,368,777 | 1/1983 | Grasso | 165/154 |
| 4,478,277 | 10/1984 | Friedman et al. | 165/185 |
| 4,567,505 | 1/1986 | Pease et al. | 357/81 |
| 4,573,067 | 2/1986 | Tuckerman et al. | 357/82 |
| 4,614,227 | 9/1986 | Vogel | 165/80.4 |
| 4,628,991 | 12/1986 | Hsiao et al. | 165/80.4 |
| 4,631,636 | 12/1986 | Andrews | 361/385 |
| 4,715,438 | 12/1987 | Gabuzda et al. | 165/185 |
| 4,765,397 | 8/1988 | Chrysler et al. | 165/104.33 |

FOREIGN PATENT DOCUMENTS

| | | | |
|---|---|---|---|
| 105152 | 7/1926 | Austria | 165/147 |
| 34223 | 8/1981 | European Pat. Off. | 361/384 |
| 679600 | 8/1939 | Fed. Rep. of Germany | 165/146 |

*Primary Examiner*—Martin P. Schwadron
*Assistant Examiner*—Allen J. Flanigan
*Attorney, Agent, or Firm*—Fulbright & Jaworski

[57] ABSTRACT

A fluid heat exchanger for cooling an electronic component having a housing for receiving heat from the electronic component in which the housing has a fluid inlet and an outlet at opposite ends of the housing. The cross-sectional area of the housing for conveying fluid from the inlet to the outlet decreases from the inlet to the outlet thereby reducing pressure drop without sacrificing thermal performance. The cross-sectional area may be decreased by tilting a top of the housing relative to a bottom, or providing a plurality of fins separated by channels in which the cross-sectional area of the channels decreases from the inlet to the outlet.

4 Claims, 4 Drawing Sheets

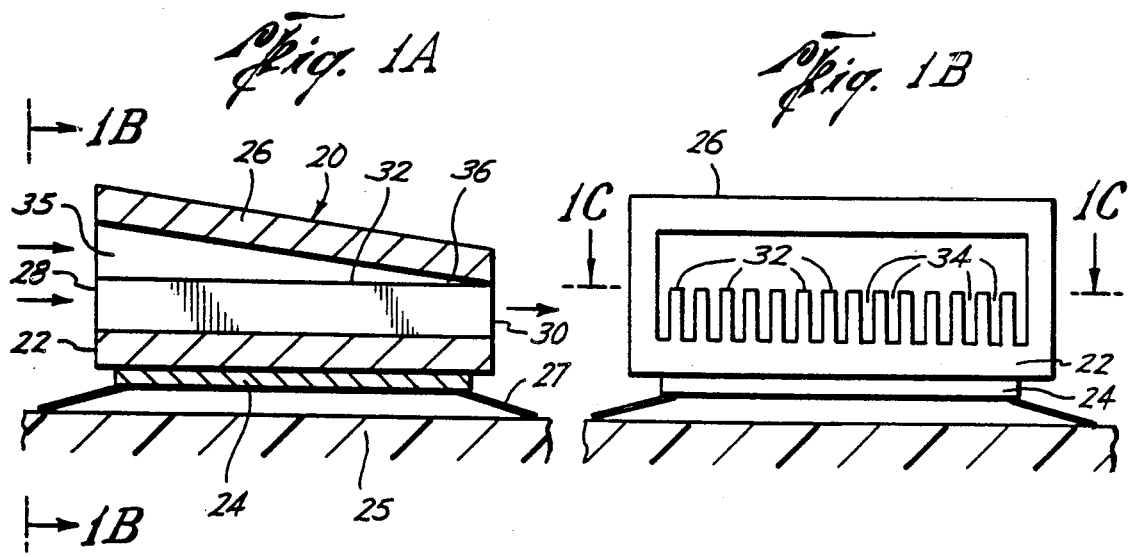
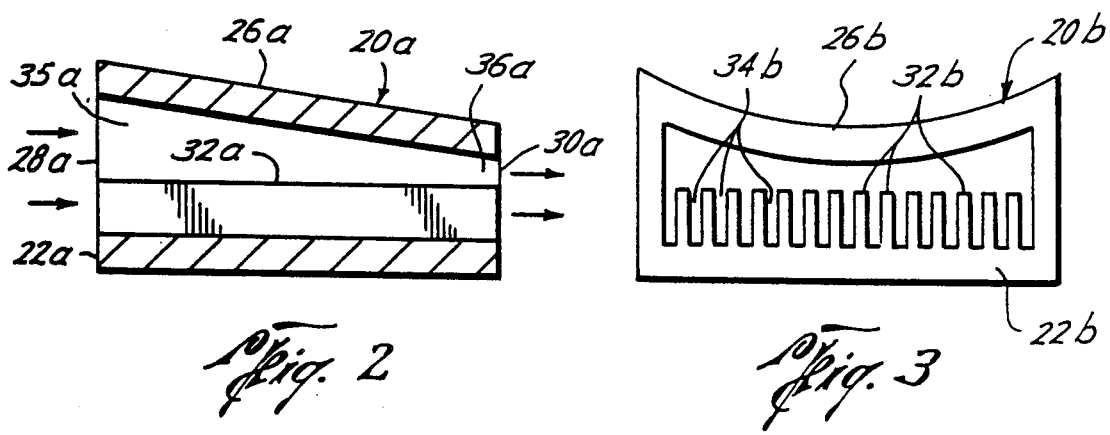
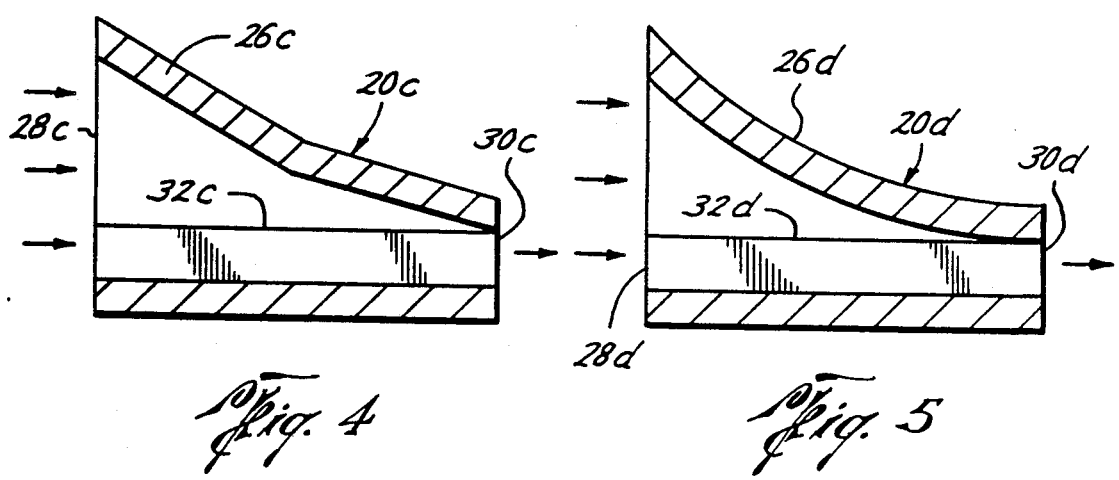

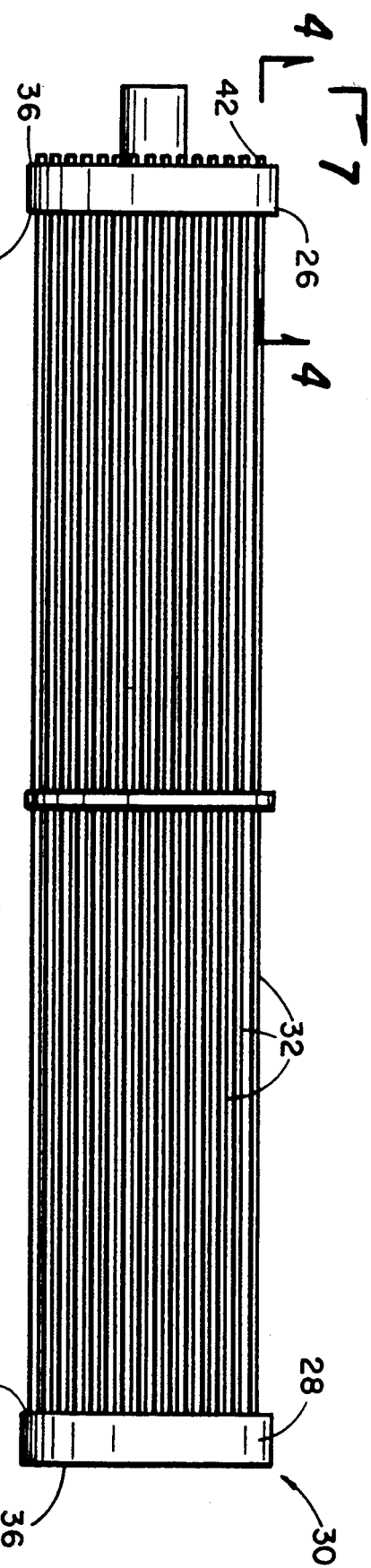
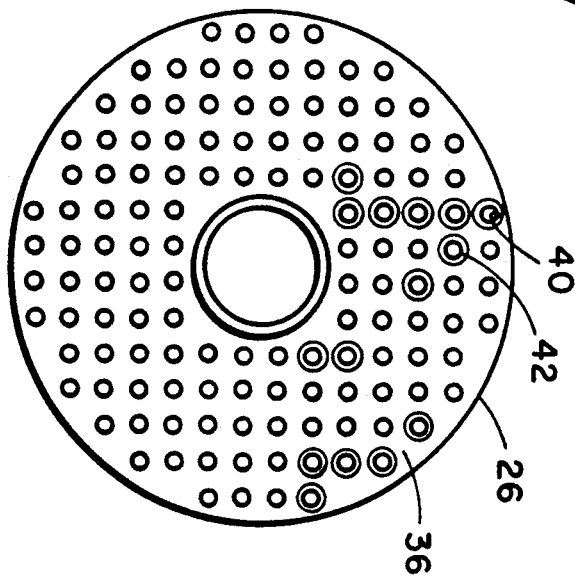
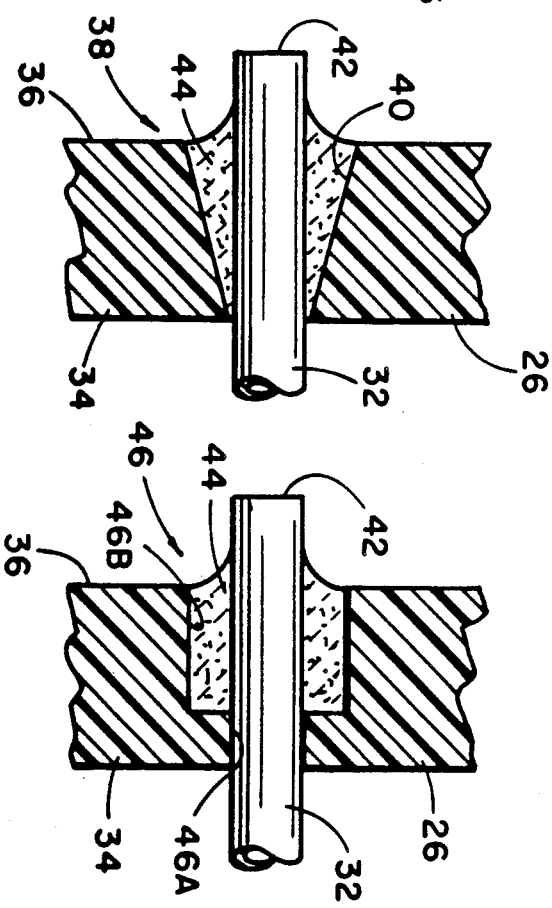
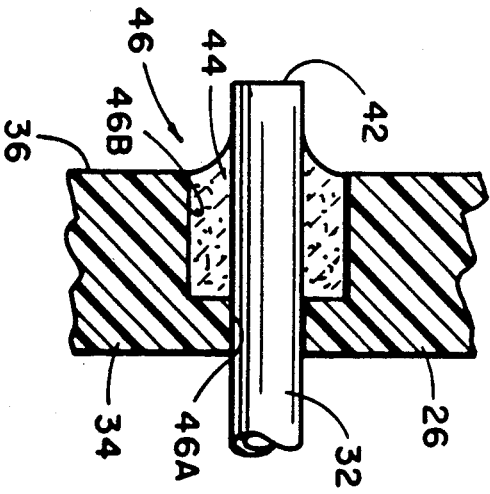

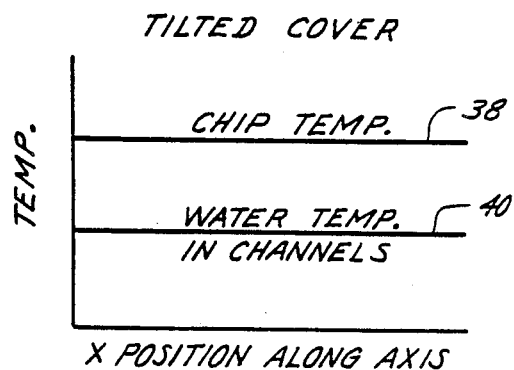
Fig. 9
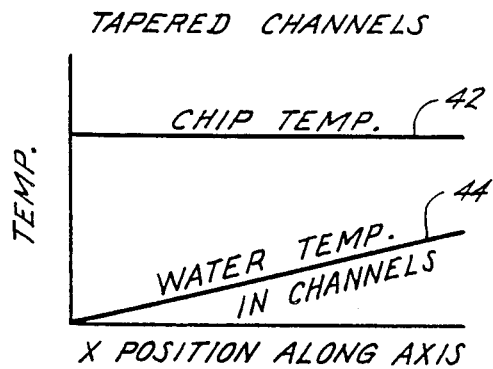
Fig. 10
Fig. 11
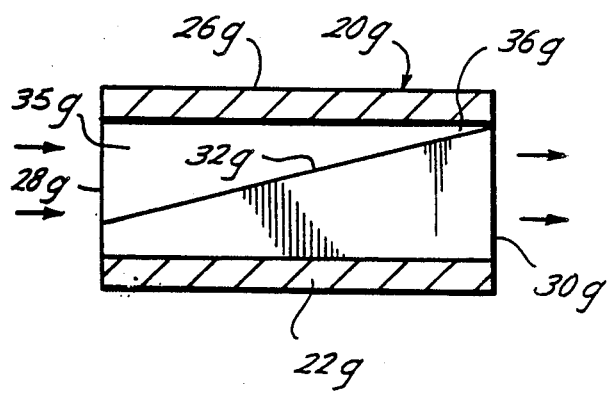
Fig. 12
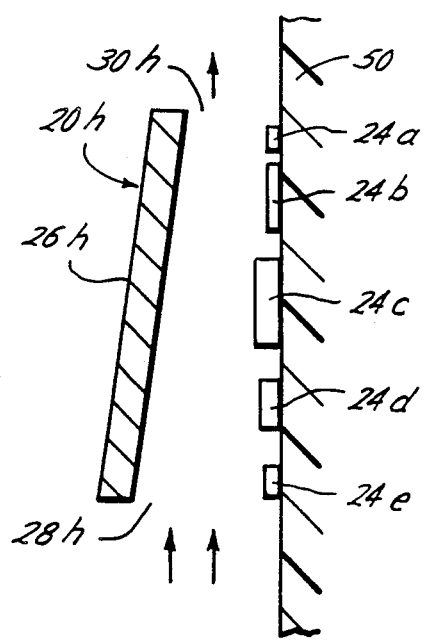

LOW PRESSURE HIGH HEAT TRANSFER FLUID HEAT EXCHANGER

This is a division of application Ser. No. 07/341,006, filed 04/20/89, now U.S. Pat. No. 4,953,634.

BACKGROUND OF THE INVENTION

In high efficiency fluid heat exchangers, such as liquid cooled microchannel or finned cold plates and coolers for electronic chips, the "caloric thermal resistance" may be high enough that the coolant, and therefore the cooled plate, have a significant thermal gradient from inlet to outlet. That is, the temperature of the fluid rises along the length in proportion to the product of flow volume and the magnitude of the heat flux, divided by the specific heat. In conventional heat exchangers, the fluid flows down channels of uniform cross-section formed by fins of uniform cross-section. Except for the inlet region, the heat transfer coefficient is constant along the length of the fin and is inversely proportional to the channel's hydraulic diameter. Similarly, the frictional drag on the flowing fluid is constant along the length of the channel and is inversely proportional to the hydraulic diameter and the flow rate. A result is that the hottest temperature of the cooling fluid and also of the electronic chip is at the fluid outlet. All of the other temperatures along the fluid path of the heat exchanger and the electronic chip are lower and thus there is a non-uniform temperature across the electronic component to be cooled. In addition, such structures create high pressure drops due to fluid friction in the channels.

The present invention is directed to a low pressure high heat transfer fluid heat exchanger, either gas or liquid, which may be used with finned heat exchangers or microchannel heat exchangers which will provide lower pressure drops, and better temperature uniformity without a sacrifice in the thermal performance and without requiring more fluid flow.

The present invention obtains these advantages by decreasing the cross-sectional area in the housing, through which the fluid is conveyed, from the inlet to the outlet of the heat exchanger.

Various embodiments are provided for decreasing the overall hydraulic diameter from the inlet to the outlet. Thus, the heat transfer is lower near the inlet because either the local "caloric" thermal resistance is high or the local convective thermal resistance is high, but the pressure gradient adjacent the inlet region is low because the velocity is low and the hydraulic diameter is large. The present invention is particularly attractive for electronic components where the heat flux is fixed and more or less uniform spatially and where more uniform temperatures across the component would be an advantage. However, the cross-sectional area may be modified along the length of the heat exchanger for optimizing the temperature at various points if desired.

SUMMARY

The present invention is directed to a fluid heat exchanger for cooling an electronic component and includes a housing for receiving heat from an electronic component. The housing includes a fluid inlet and a fluid outlet at opposite ends of the housing and the cross-sectional area of the housing, through which the fluid is conveyed, decreases from the inlet to the outlet. This provides a lower pressure drop for the fluids flowing through the heat exchanger without a sacrifice in thermal performance, and without requiring more fluid flow.

In one embodiment of the invention, the housing includes a top and a bottom in which the bottom is adjacent the electronic component and the top is tilted relative to the bottom with the top being closer to the bottom at the fluid outlet than at the fluid inlet.

In another embodiment, a plurality of fins separated by fluid channels are positioned in the housing and the cross-sectional area of the channels decreases from the inlet to the outlet. This may be accomplished by providing that the fins converge toward each other from the inlet towards the outlet or the cross-sectional area of the fins may increase from the inlet to the outlet.

Still a further object of the present invention is whereby the channel cross-sectional area may decrease linearly wherein the heat flux from the electronic component is approximately uniform spatially thereby providing better temperature uniformity. However, the cross-sectional area decrease maY be non-linear in those cases where it is desired to optimize the temperature at various points along the heat exchanger and electronic component.

A still further object of the present invention is wherein a plurality of fins separated by fluid channels are positioned in the housing, and the top of the housing is spaced from the fins for decreasing the pressure drop.

A still further object of the present invention is the provision of a fluid heat exchanger for cooling an electronic component which includes a housing having a base for receiving heat from an electronic component, a top, first and second opposing ends, a fluid inlet at the first end and a fluid outlet at the second end. A plurality of spaced fins are connected to the base and extend from the inlet to the outlet. The top is positioned in a non-parallel relationship relative to the base providing a cross-sectional area in the housing which conveys fluid from the inlet to the outlet and which decreases from the inlet to the outlet.

Yet a still further object of the present invention is wherein the heat exchanger includes a housing having a base for receiving heat from an electronic component and having first and second opposing ends, a fluid inlet at the first end and a fluid outlet at the second end. A plurality of spaced fins are connected to the base and extend from the inlet to the outlet. The fins are separated by fluid channels in which the cross-sectional area of the channels decreases from the inlet to the outlet.

Yet a further object of the present invention is the provision of a fluid heat exchanger for cooling a plurality of electronic components which includes a housing including a circuit board having a plurality of electrical components positioned in the housing. The housing includes first and second ends with a fluid inlet at one end and a fluid outlet at the opposite end. The cross-sectional area in the housing decreases from the inlet to the outlet.

Other and further objects, features and advantages will be apparent from the following description of presently preferred embodiments of the invention, given for the purpose of disclosure and taken in conjunction with the accompanying drawings.

BRIEF DESCRIPTION OF THE DRAWINGS

FIG. FIG. 1A is an elevational view, in cross section, illustrating one embodiment of the present invention, FIG. 1B is a cross-sectional view taken along the line 1B—1B of FIG. 1A, FIG. 2 is an elevational cross-sectional view of another embodiment of the invention, FIG. 3 is a cross-sectional end view of a further embodiment of the invention, FIG. 4 is an elevational view, in cross section, of a still further embodiment of the invention, FIG. 5 is an elevational view, in cross section, of a still further embodiment of the invention, FIG. 9 is a graph showing the temperature variations in a chip and water temperature of the embodiment of FIG. 1A, FIG. 10 is a graph illustrating the variations in temperature of the chip and water temperature of the heat exchanger shown in FIG. 6, FIG. 11 is an elevational view, in cross section, of a still further embodiment of the invention, FIG. 12 is an elevational view, in cross section, illustrating still a further embodiment of the invention, and FIG. 13 is a graph illustrating the pressure drop versus flow rate for various embodiments of the present invention and a conventional heat exchanger.

DESCRIPTION OF THE PREFERRED EMBODIMENTS

Figure 8:
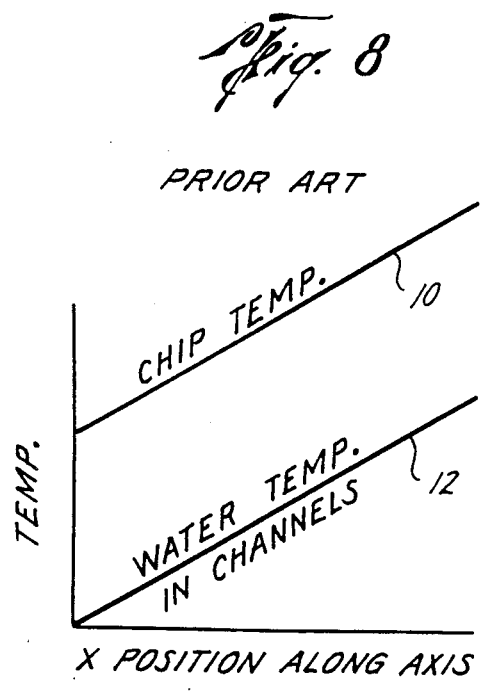
FIG. 8 is graph illustrating the temperature variations of an electronic chip and water temperature of a conventional heat exchanger.

Conventional heat exchangers used to cool electronic components or chips generally include a housing having a fluid inlet at one end and a fluid outlet at the opposite end in which the fluid flows down channels of uniform cross-section formed by fins of uniform cross section. The result as shown in the prior art graph of FIG. 8 is that both the chip temperature 10 and the water temperature 12 in the channels are hottest at the fluid outlet thereby creating an undesirable non-uniform temperature across the electronic component. In addition, such heat exchangers create high fluid pressure drops which are undesirable.

Figure 1C:
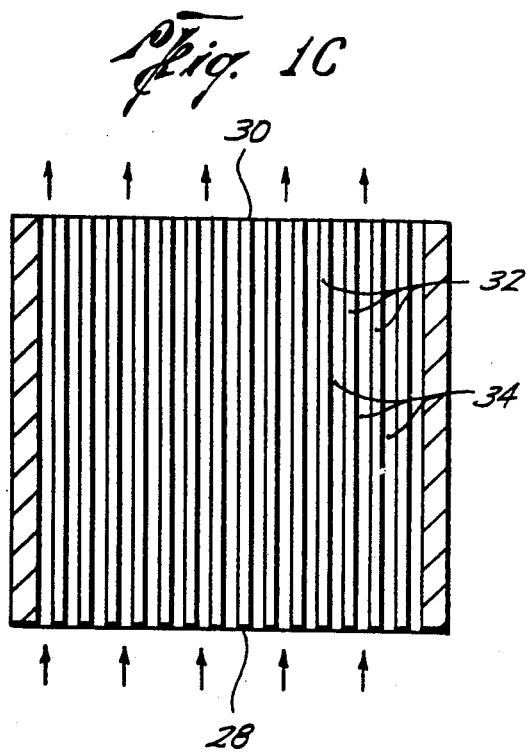
FIG. 1C is a cross-sectional view taken along the line 1C—1C of FIG. 1B.

Referring now to FIGS. 1A, 1B and 1C, the present invention is directed to providing a fluid heat exchanger generally indicated by the reference numeral 20, in which the fluid may be gas or liquid, and includes a housing having a base 22 for receiving heat from an electronic component or chip 24 which may be supported from a substrate 25 by suitable electrical connections 27. The housing also includes a top 26, a first end 28, and a second end 30. The first end 28 may be the fluid inlet and the second end 30 may be the fluid outlet.

A plurality of spaced fins 32 which are separated by fluid channels 34 are positioned in the housing and extend from the inlet end 28 to the outlet end 30.

The above general description of a heat exchanger is generally conventional. However, the present invention provides the heat exchanger 20 with a cross-sectional area in the housing that decreases from the inlet end 28 to the outlet end 30. This is accomplished in the embodiment of FIGS. 1A, 1B and 1C by tilting the top 26 wherein the fluid cross-sectional area 35 adjacent the inlet end 28 is larger than the fluid cross-sectional area 36 adjacent the fluid outlet end 30. That is, the overall hydraulic diameter is larger nearer the inlet 28 than the outlet 30 and the majority of fluid flow near the inlet end 28 is not in the channels 34 between the fins 32. Thus, the heat transfer is lower in the cross-sectional area 35 because the "caloric" thermal resistance is high. That is, only the fluid between the fins 32 is actually involved in heat transfer in this area and heats up significantly. It is also to be noted that the pressure gradient in the area 35 is low because the velocity is low and the hydraulic diameter is large. As the fluid progresses from the inlet end 28 towards the outlet end 30, cool fluid from the area between the top 26 and the fins 32 is constantly added to the channels 34 between the fins 32, restoring the fluid's ability to further absorb heat. This feature of decreasing the cross-sectional area of the fluid flow in the housing from the inlet 28 to the outlet 30 is particularly attractive for electronic component cooling where the heat flux from the component is fixed and more or less uniform spatially, and where more uniform temperatures across the electronic component 24 would be an advantage. This advantage is thus seen in comparing the graphs of FIG. 9, relating to the embodiment of FIGS. 1A, 1B and 1C, in which the temperature 38 of the electronic component or chip 24 and the water temperature 40 in the channels 34 along the longitudinal X axis between the inlet 28 and outlet 30 is substantially constant and advantageous over the characteristics of the conventional prior art heat exchangers shown in FIG. 8. In the embodiment of FIGS. 1A–1C, as the cooling fluid progresses toward the outlet 30, a greater volume of fluid, at a higher velocity, with the addition of cooler fluid in the channels 34 allows the heat exchanger to provide uniform heat dissipation.

Other and further embodiments of the present invention may be provided for obtaining a configuration in which the cross-sectional area in the housing decreases from the inlet to the outlet. Other and further embodiments of the invention will be described in which like parts to those in FIGS. 1A, 1B and 1C are similarly numbered with the addition of the suffix "a", "b", "c", "d", "e", "f", "g" and "h".

Referring now to FIG. 2, this embodiment is similar to that shown in FIGS. 1A, 1B and 1C with the exception that the top 26a is raised or spaced from the tops of the fins 32a which increases the cross-sectional areas 35a and 36a which further decreases the fluid pressure drop through the heat exchanger 20a. The heat exchanger 20a, because of this low pressure drop feature and increased fluid capacity, is particularly suitable for use in being connected in series with other similar heat exchangers 20a.

While the top of the heat exchanger may be tilted for decreasing the cross-sectional area from the inlet to the outlet, the top may be of any desired shape.

Referring to FIG. 3, the top 26b, while tilted, may be concave in cross section from side to side for the purpose of increasing the fluid flow along the sides of the heat exchanger 20b since normally the fluid velocity and fluid flow is greatest along the longitudinal X axis of the heat exchanger. This is useful where the electronic component to be cooled is hotter on the sides than in the middle.

In FIG. 4, the top 26c, while tilted, may be directed at various angles or made curved as the top 26d in FIG. 5 for adjusting or optimizing the temperature at various points along the longitudinal or X axis of the heat exchangers 20c and 20d where high heat transfer is not desired. Thus, the cross-sectional area may decrease linearly as in FIGS. 1A, 1B and 1C, 2 and 3 or non-linearly as best seen in FIGS. 4 and 5.

Figure 6:
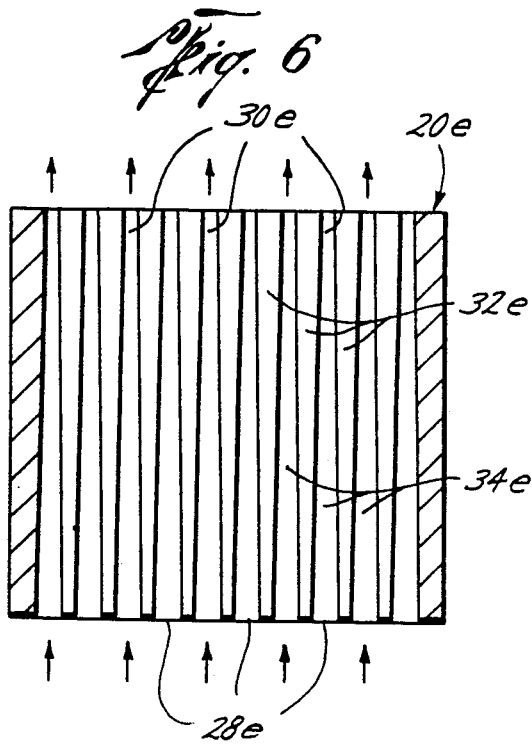
FIG. 6 is a top elevational view, in cross section, similar to FIG. 1C of another embodiment of fins and channels.

Referring now to FIG. 6, another structure for decreasing the cross-sectional area of the fluid path from the inlet to the outlet is shown. In the embodiment of FIG. 6, the channels 34e decrease in cross-sectional area from the inlet 28e toward the outlet 30e as distinguished from the structure shown in FIG. 1C. This can be done by tapering the channels 34e from a wide inlet 28e to a narrow outlet 30e. Again, the pressure loss adjacent the inlet 28e is reduced. Adjacent the outlet 30e the channels 34e are narrow to optimize heat transfer to the fluid and the local pressure gradient is higher. Referring to FIG. 10, the electronic component or chip temperature 42 and the fluid or water temperature 44 in channels are shown relative to the position along the longitudinal or x axis of the heat exchanger 20e. It is noted that the heat exchanger 20e provides a uniform temperature along the electronic component or chip. The fins 32e and channels 34e structure may be used in the housing of heat exchanger 20 of FIGS. 1A, 1B and 1C in which the top 26 is tilted or may be in a conventional housing in which the top 26 is not tilted.

Figure 7:
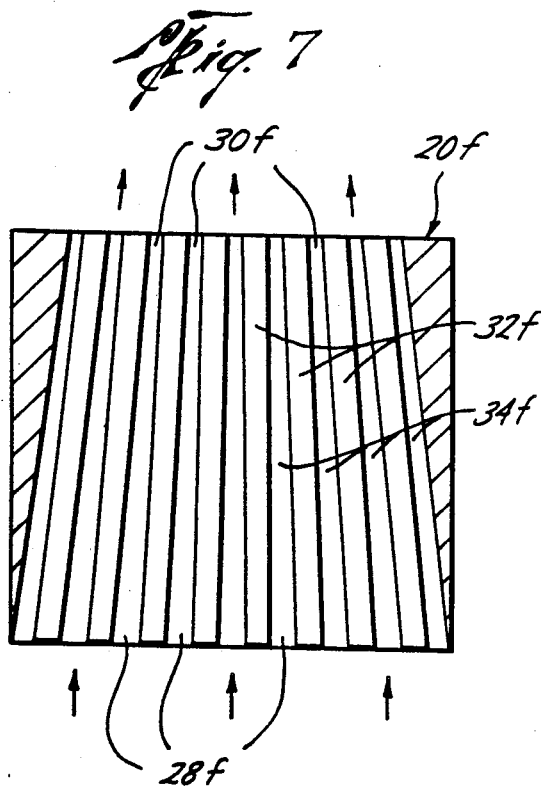
FIG. 7 is a view similar to FIG. 1C and 6 showing a still further embodiment of arrangement of fins and channels.

Referring now to FIG. 7, another embodiment of a heat exchanger 20f is shown in which both the fins 32f and channels 34f are slanted inwardly from the inlet end 28f toward the outlet end 30f for decreasing the cross-sectional area of the fluid path from the inlet 28f toward the outlet 30f.

Referring now to FIG. 11, another embodiment of heat exchanger 20g is best seen in which the top 26g may be tilted or as shown herein parallel to the base 22g. In this embodiment, the fins 32g are spaced from each other and separated by channels but the fins 32g increase in cross-sectional area in a vertical direction from the inlet end 28g to the outlet 30g. Again, this provides the advantages of the previously described embodiments of a lower pressure drop and uniform cooling of electrical components by increasing the cross-sectional area 35g adjacent the inlet end 28g and decreasing the cross-sectional area 35g adjacent the outlet 36g. Again the cross-sectional area of the first path in the heat exchanger 20g decreases from the inlet 28g to the outlet 30g.

Referring now to FIG. 12, a still further embodiment of a heat exchanger 20h is best seen in which a plurality of electrical components 24a, 24b, 24c, 24d and 24e are positioned on a circuit board 50 forming part of the housing of the heat exchanger 20h in which a top 26h is slanted. That is, the cross-sectional area in the housing decreases from the inlet end 28h to the outlet end 30h. The present invention is particularly advantageous wherein the convectively cooled electronic components 24a-24e are mounted so that the downstream components become hotter due to upstream heat dissipation. Using the slanted top 26h, the temperature of the downstream electronic components can be made more nearly uniform while at the same time reducing the overall pressure drop through the heat exchanger 20h.

Referring now to FIG. 13, the advantages of lower pressure drops of the present invention are best seen. Graph 60 indicates the pressure drop versus flow rate in a conventional heat exchanger having straight channels and a cover positioned against the fins and parallel to the base. Graph 62 illustrates the pressure drop versus flow rate for the tapered channel embodiment of FIG. 6 and Graph 64 illustrates the pressure drop versus flow rate for the embodiment of FIG. 1A, 1B and 1C. Therefore, the advantage of the present invention for providing reduced pressure drops through the present heat exchangers versus the conventional heat exchanger is clearly shown.

Tests have shown that the tapered channels of the embodiment of FIG. 6 with a taper of 2:1 in the channel reduced microchannel heat exchanger pressure loss by a factor of two or more over conventional heat exchangers for the same coolant flow rate and maximum chip temperature. The tilted cover embodiment of FIG. 1A, 1B and 1C on straight microchannels reduced pressure loss by a factor of two or more with only a small reduction in thermal performance. Both tilted covers and tapered channels improved temperature uniformity of the electronic component.

The present invention, therefore, is well adapted to carry out the objects and attain the ends and advantages mentioned as well as others inherent therein. While presently preferred embodiments of the invention have been given for the purpose of disclosure, numerous changes in the details of construction and arrangement of parts will be readily apparent to those skilled in the art and which are encompassed within the spirit of the invention and the scope of the appended claims.

What is claimed is:

1. A fluid heat exchanger for cooling an electronic component comprising,
a housing having a base for receiving heat from an electronic component and having first and second opposing ends, a fluid inlet at the first end and a fluid outlet at the second end,
a plurality of spaced fins connected to the base and extending from the inlet to the outlet, said fins separated by fluid channels in which the cross-sectional area of the channels decreases from the inlet to the outlet, and
wherein the cross-sectional area of the fins increases from the inlet to the outlet.

2. A fluid heat exchanger for cooling an electronic component comprising,
a housing having a base for receiving heat from an electronic component and having first and second opposing ends, a fluid inlet at the first end and a fluid outlet at the second end,
a plurality of spaced fins connected to the base and extending from the inlet to the outlet, said fins separated by fluid channels in which the cross-sectional area of the channels decreases from the inlet to the outlet, and
wherein said fluid channels are formed by the fins which are tapered in a direction parallel to said base from the inlet to the outlet.

3. A fluid heat exchanger for cooling an electronic component comprising,
a housing for receiving heat from an electronic component,
said housing having a fluid inlet and a fluid outlet at opposite ends of the housing,
the cross-sectional area perpendicular to the direction of fluid flow in the housing for conveying fluid from the inlet to the outlet decreasing from the inlet to the outlet,
the housing includes a top and a wall, said wall adapted to be positioned adjacent said electronic component in a heat conducting relationship,
a plurality of fins, separated by channels, positioned in the housing and connected to the wall, said channels intersecting a single plane extending parallel to said wall, and the cross-sectional width of the channels in the plane decreasing from the inlet to the outlet.

4. The apparatus of claim 3 wherein the channels taper in the plane from the inlet to the outlet.

* * * * *

UNITED STATES PATENT OFFICE
CERTIFICATE OF CORRECTION

Patent No. 5,002,123  Dated March 26, 1991

Inventor(s) Richard D. Nelson et al.

It is certified that error appears in the above-identified patent and that said Letters Patent is hereby corrected as shown below:

Column 2, line 20, delete "maY" and replace it with -- may --

Column 2, line 65, delete the second occurrence of -- FIG. --

Column 4, line 10, delete "velocitY" and replace it with -- velocity --

Signed and Sealed this

Second Day of February, 1993

*Attest:*

STEPHEN G. KUNIN

*Attesting Officer*     *Acting Commissioner of Patents and Trademarks*